United States Patent
Hsiung

(10) Patent No.: US 11,437,512 B2
(45) Date of Patent: Sep. 6, 2022

(54) BURIED CHANNEL METAL-OXIDE-SEMICONDUCTOR FIELD-EFFECT TRANSISTOR (MOSFET) AND FORMING METHOD THEREOF

(71) Applicant: UNITED MICROELECTRONICS CORP., Hsin-Chu (TW)

(72) Inventor: Chang-Po Hsiung, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 247 days.

(21) Appl. No.: 16/934,030

(22) Filed: Jul. 21, 2020

(65) Prior Publication Data
US 2021/0399132 A1    Dec. 23, 2021

(30) Foreign Application Priority Data
Jun. 18, 2020  (CN) .......................... 202010558380.6

(51) Int. Cl.
*H01L 29/78* (2006.01)
*H01L 21/8238* (2006.01)

(52) U.S. Cl.
CPC .. *H01L 29/7838* (2013.01); *H01L 21/823807* (2013.01); *H01L 21/823814* (2013.01); *H01L 29/7834* (2013.01)

(58) Field of Classification Search
CPC ......... H01L 29/7838; H01L 21/823807; H01L 21/823814; H01L 29/7834
See application file for complete search history.

(56) References Cited

U.S. PATENT DOCUMENTS

| | | | |
|---|---|---|---|
| 6,518,623 | B1 | 2/2003 | Oda |
| 6,642,581 | B2 | 11/2003 | Matsuda |
| 7,964,896 | B2 | 6/2011 | Kiewra |
| 9,059,321 | B2 | 6/2015 | Cheng |
| 2012/0252198 | A1* | 10/2012 | Zhu ..................... H01L 29/7833 438/585 |

* cited by examiner

*Primary Examiner* — Shahed Ahmed
*Assistant Examiner* — Vicki B. Booker
(74) *Attorney, Agent, or Firm* — Winston Hsu

(57) ABSTRACT

A buried channel MOSFET includes a dielectric layer, a gate and a buried channel region. The dielectric layer having a recess is disposed on a substrate. The gate is disposed in the recess, wherein the gate includes a first work function metal layer having a "-" shaped cross-sectional profile, and a minimum distance between each sidewalls of the first work function metal layer and the nearest sidewall of the recess is larger than zero. The buried channel region is located in the substrate right below the gate. The present invention provides a method of forming said buried channel MOSFET.

20 Claims, 5 Drawing Sheets

Therefore, hot carriers induced while voltage being applied can flow in the buried channel region and be far away from a surface of the substrate, to reduce gate impact and circuit leakage such as sub-threshold leakage and gate induced drain leakage (GIDL), hence improving the device reliability.

These and other objectives of the present invention will no doubt become obvious to those of ordinary skill in the art after reading the following detailed description of the preferred embodiment that is illustrated in the various figures and drawings.

BURIED CHANNEL METAL-OXIDE-SEMICONDUCTOR FIELD-EFFECT TRANSISTOR (MOSFET) AND FORMING METHOD THEREOF

BACKGROUND OF THE INVENTION

1. Field of the Invention

The present invention relates generally to a metal-oxide-semiconductor field-effect transistor (MOSFET) and forming method thereof, and more specifically to a buried channel metal-oxide-semiconductor field-effect transistor (MOSFET) and forming method thereof.

2. Description of the Prior Art

Field effect transistors are important electronic devices in the fabrication of integrated circuits. In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. Furthermore, as buried channel metal-oxide-semiconductor field-effect transistors are applied, doped regions are formed below gate structures for carriers being far away from a surface of a substrate while flowing through source regions and drain regions.

SUMMARY OF THE INVENTION

The present invention provides a buried channel MOSFET and manufacturing method thereof, which forms a work function metal layer as a part of a gate right above a buried channel region, to reduce circuit leakage and enhance the reliability of the transistor.

The present invention provides a buried channel MOSFET including a dielectric layer, a gate and a buried channel region. The dielectric layer having a recess is disposed on a substrate. The gate is disposed in the recess, wherein the gate includes a first work function metal layer having a "-" shaped cross-sectional profile, and a minimum distance between each sidewalls of the first work function metal layer and the nearest sidewall of the recess is larger than zero. The buried channel region is located in the substrate right below the gate.

The present invention provides a method of manufacturing a buried channel MOSFET including the following steps. A substrate is provided. A buried channel region is formed in the substrate. A dielectric layer having a recess is formed on the substrate, wherein the recess is right above the buried channel region. A first work function metal layer having a "-" shaped cross-sectional profile is formed in the recess, wherein a minimum distance between each sidewalls of the first work function metal layer and the nearest sidewall of the recess is larger than zero.

According to the above, the present invention provides a buried channel MOSFET and manufacturing method thereof, which forms a dielectric layer having a recess on a substrate, disposes a gate in the recess, forms a buried channel region in the substrate right below the gate, wherein the gate includes a first work function metal layer having a "-" shaped cross-sectional profile, and a minimum distance between each sidewalls of the first work function metal layer and the nearest sidewall of the recess is larger than zero.

DETAILED DESCRIPTION

Figure 1:
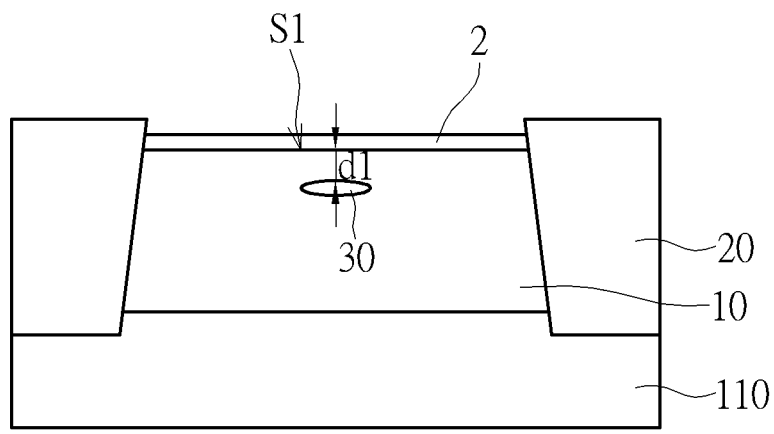
FIG. 1 schematically depicts a cross-sectional view of a method of manufacturing a buried channel MOSFET according to an embodiment of the present invention.

FIGS. 1-9 schematically depict cross-sectional views of a method of manufacturing a buried channel MOSFET according to an embodiment of the present invention. In this embodiment, the method of the present invention is applied for forming a medium voltage MOSFET, but the method of the present invention can also be applied to form logic (low voltage) MOSFETs or input/output (high voltage) MOSFETs etc. As shown in FIG. 1, a substrate 110 is provided, wherein the substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. A well 10 such as an N well or a P well may be doped in the substrate 110, depending upon practical requirements. In this case, the well 10 is a P well.

Isolation structures 20 are formed in the substrate 110 to electrically isolate each transistor. The isolation structures 20 may be shallow trench isolation (STI) structures, which may be formed by a shallow trench isolation (STI) process, but it is not limited thereto. Methods of forming the isolation structures 20 may include the following. A hard mask layer (not shown) is formed on the substrate 110. In this embodiment, the hard mask layer (not shown) includes a pad oxide layer (not shown) and a pad nitride layer (not shown) stacked from bottom to top. An etching process is performed to pattern the pad nitride layer (not shown) and the pad oxide layer (not shown), therefore a patterned hard mask layer (not shown) being formed, wherein the patterned hard mask layer (not shown) includes a pad oxide layer 2 and a pad nitride layer (not shown) stacked from bottom to top for defining areas of the substrate for forming trenches. Then, an etching process is performed to form the trenches in the substrate 110 and the isolation structures 20 fill into the trenches. Thereafter, the pad nitride layer (not shown) is removed.

A buried channel region 30 is formed in the substrate 110. In this embodiment, the buried channel region 30 is N-type, which may be doped with arsenic, but it is not limited thereto. In a preferred embodiment, a depth d1 of the buried channel region 30 from a surface S1 of the substrate 110 is 400-900 angstroms. In this way, hot carriers induced while voltage being applied thus flow in the buried channel region 30 and are far away from the surface S1 of the substrate 110, to reduce gate impact and circuit leakage such as sub-threshold leakage and gate induced drain leakage (GIDL), hence improving the device reliability.

Figure 2:
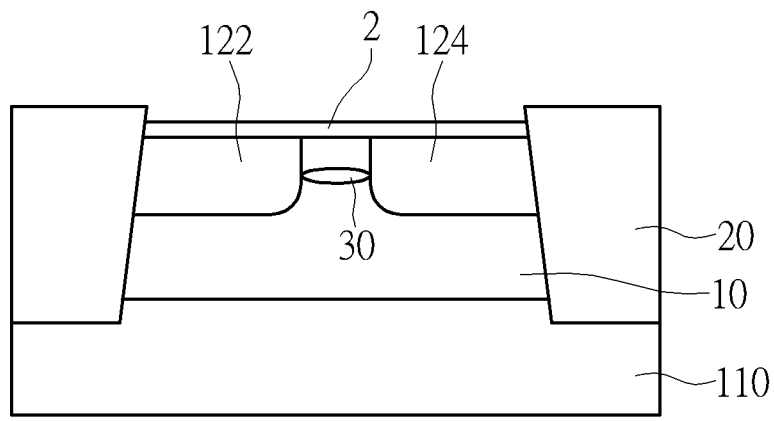
FIG. 2 schematically depicts a cross-sectional view of a method of manufacturing a buried channel MOSFET according to an embodiment of the present invention.

As shown in FIG. 2, a doping process may be performed to form a lightly doped source region 122 and a lightly doped drain region 124 in the substrate 110. In this embodiment, the lightly doped source region 122 and the lightly doped drain region 124 are N-type, which may be doped with arsenic, but it is not limited thereto.

Figure 3:
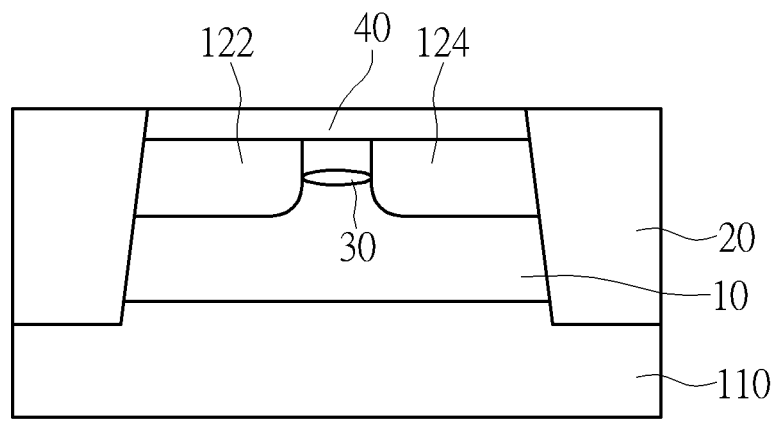
FIG. 3 schematically depicts a cross-sectional view of a method of manufacturing a buried channel MOSFET according to an embodiment of the present invention.
Figure 4:
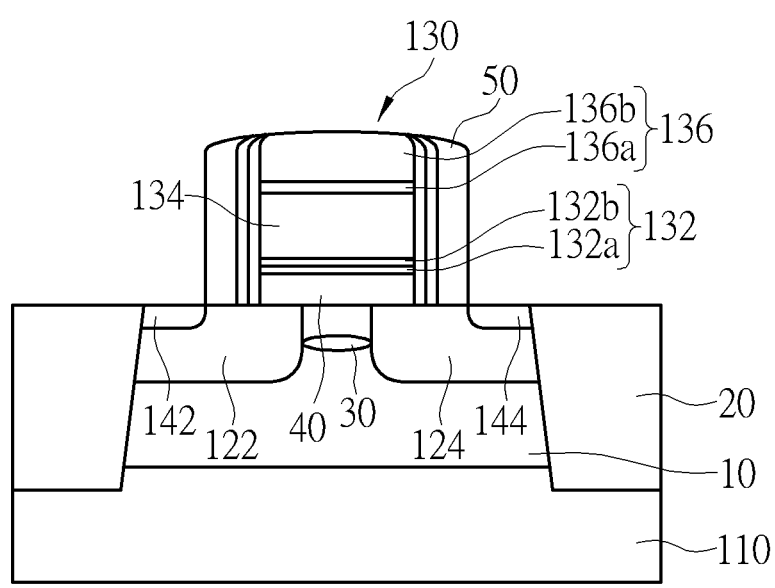
FIG. 4 schematically depicts a cross-sectional view of a method of manufacturing a buried channel MOSFET according to an embodiment of the present invention.

Please refer to FIGS. 3-4, a sacrificial gate 130 is formed on the substrate 110, so that the lightly doped source region 122 and the lightly doped drain region 124 are disposed in the substrate 110 beside the sacrificial gate 130, and parts of the lightly doped source region 122 and the lightly doped drain region 124 are located right below the sacrificial gate 130. In this embodiment, as shown in FIG. 3, the pad oxide layer 2 is removed, and then an oxide layer 40 is formed on the substrate 110 between the isolation structures 20. As shown in FIG. 4, the sacrificial gate 130 is formed on the oxide layer 40, and spacers are formed beside the sacrificial gate 130. The sacrificial gate 130 may include a gate dielectric layer 132, a gate electrode 134 and a cap layer 136 stacked from bottom to top, wherein the gate dielectric layer 132 may include a buffer layer 132a and a dielectric layer having a high dielectric constant 132b, the gate electrode 134 may be a polysilicon gate, the cap layer 136 may include an oxide layer 136a and a nitride layer 136b, and the spacers 50 may be single layers or multilayers composed of silicon oxide, silicon nitride or silicon oxynitride etc. Methods of forming the sacrificial gate 130 and the spacers 50 are well-known in the art, and are not described.

A doping process may be performed to form a source region 142 and a drain region 144 in the substrate 110 beside the sacrificial gate 130. In one case, the source region 142 and the drain region 144 are N-type, which may be doped with arsenic, but it is not limited thereto.

Figure 5:
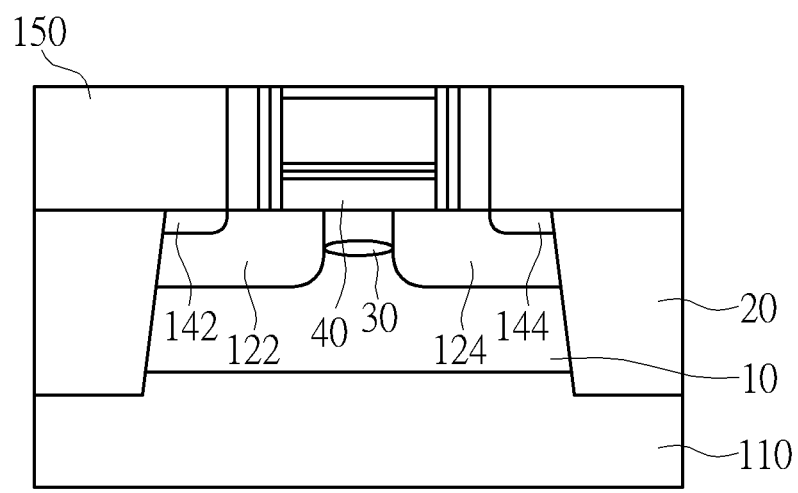
FIG. 5 schematically depicts a cross-sectional view of a method of manufacturing a buried channel MOSFET according to an embodiment of the present invention.

As shown in FIG. 5, a blanket dielectric layer (not shown) may cover the sacrificial gate 130, the spacers 50 and the substrate 110 blanketly, and then a chemical mechanical polishing (CMP) process may be performed to planarize the blanket dielectric layer, so that a dielectric layer 150 is formed on the substrate 110 beside the sacrificial gate 130. Meanwhile, the nitride layer 136b is removed completely and parts of the oxide layer 136a and parts of the spacers 50 are selectively removed. In one case, the dielectric layer 150 is an inter-dielectric layer, which may be an oxide layer.

Figure 6:
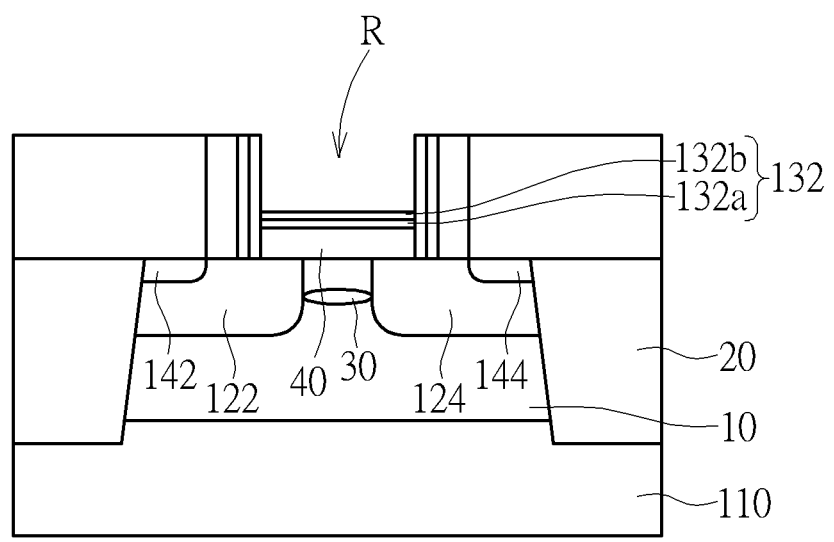
FIG. 6 schematically depicts a cross-sectional view of a method of manufacturing a buried channel MOSFET according to an embodiment of the present invention.

Thereafter, the oxide layer 136a and the gate electrode 134 are removed completely to form a recess R and expose the gate dielectric layer 132, as shown in FIG. 6. In this embodiment, the recess R is right above the buried channel region 30, and is used for forming a buried channel MOSFET.

Figure 7:
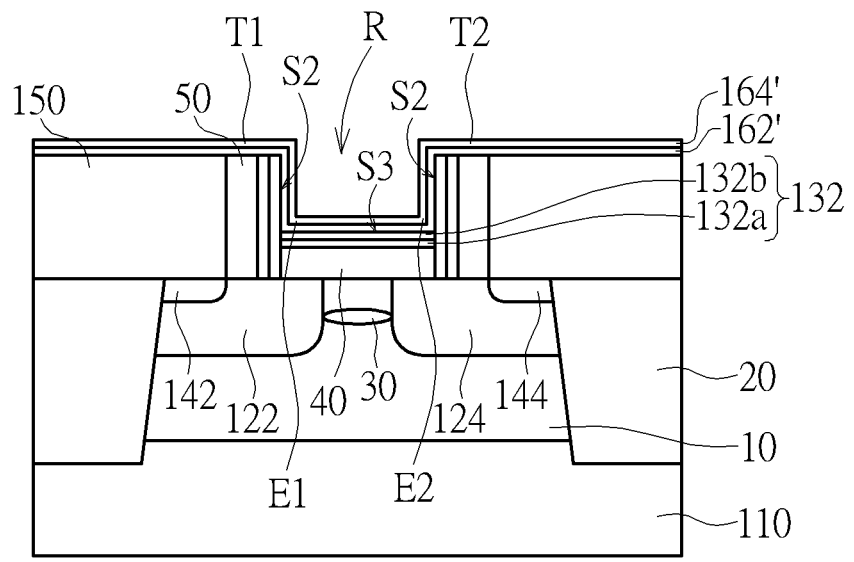
FIG. 7 schematically depicts a cross-sectional view of a method of manufacturing a buried channel MOSFET according to an embodiment of the present invention.
Figure 8:
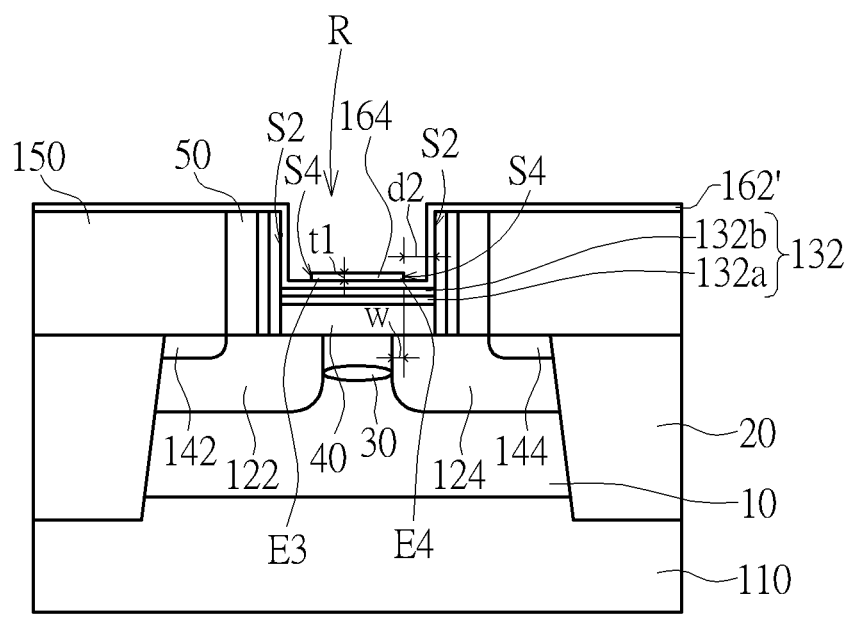
FIG. 8 schematically depicts a cross-sectional view of a method of manufacturing a buried channel MOSFET according to an embodiment of the present invention.

Please refer to FIGS. 7-8, a barrier layer 162' and a first work function metal layer 164 are formed in the recess R. As shown in FIG. 7, the barrier layer 162' and a first work function metal layer 164' are formed sequentially to conformally cover sidewalls S2 of the recess R, a bottom surface S3 of the recess R and the dielectric layer 150. As shown in FIG. 8, the work function metal layer 164' is patterned to remove two end parts E1/E2 of the work function metal layer 164' covering the bottom surface S3, and to remove sidewall parts T1/T2 of the work function metal layer 164' covering the sidewalls S2 of the recess R and the dielectric layer 150, thereby the first work function metal layer 164 being formed, wherein the first work function metal layer 164 has a "-" shaped cross-sectional profile, and the first work function metal layer 164 does not contact the sidewalls S2 of the recess R.

In other words, a minimum distance d2 between each sidewalls S4 of the first work function metal layer 164 and the nearest sidewall S2 of the recess R is larger than zero. Preferably, a width W of the first work function metal layer 164 vertically overlaps the lightly doped drain region 124 is 0-4 times of the minimum distance d2. By doing this, the first work function metal layer 164 of the present invention is located between the lightly doped source region 122 and the lightly doped drain region 124, and the first work function metal layer 164 vertically overlaps parts of the lightly doped source region 122 and the lightly doped drain region 124, so that a buried channel having hot carriers flowing therein can be induced between the lightly doped source region 122 and the lightly doped drain region 124. Moreover, in order to forming a buried channel, the first work function metal layer 164 of the present invention does not vertically overlap the source region 142 and the drain region 144.

In a preferred embodiment, the first work function metal layer 164 vertically overlaps the buried channel region 30 completely to reduce circuit leakage. In a still preferred embodiment, two ends E3/E4 of the first work function metal layer 164 protrude from the buried channel region 30 for ensuring the first work function metal layer 164 vertically overlapping the buried channel region 30 completely. For instance, a thickness t1 of the first work function metal layer is at a range of 50-150 angstroms.

Figure 9:
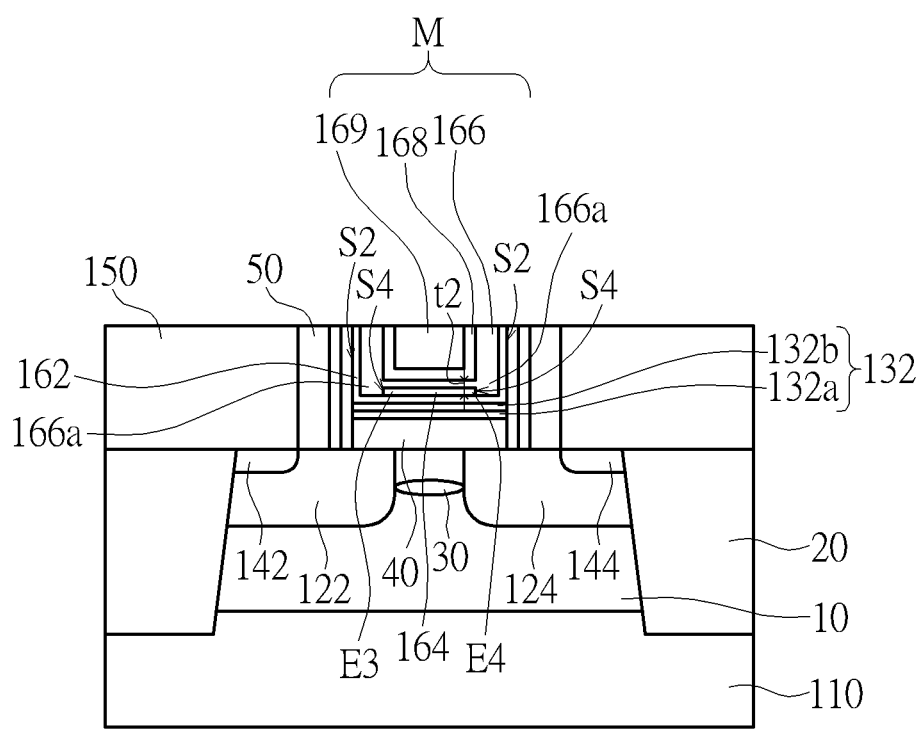
FIG. 9 schematically depicts a cross-sectional view of a method of manufacturing a buried channel MOSFET according to an embodiment of the present invention.

As shown in FIG. 9, a second work function metal layer 166 conformally covers the first work function metal layer 164 and the sidewalls S2 of the recess R. The first work function metal layer 164 and the second work function metal layer 166 have different conductive types. For example, the first work function metal layer 164 has P-type while the second work function metal layer 166 has N-type. In this embodiment, a second work function metal layer (not shown), a barrier layer (not shown) and a low resistivity material (not shown) are sequentially deposited and then the low resistivity material (not shown), the barrier layer (not shown), the second work function metal layer (not shown), and the barrier layer 162' are planarized to form a barrier layer 162, the second work function metal layer 166, a barrier layer 168 and a low resistivity material 169 in the recess R, thereby a metal gate M being formed. Since the minimum distance d2 between each of the sidewalls S4 of the first work function metal layer 164 and the nearest sidewall S2 of the recess R is larger than zero, parts 166a of the second work function metal layer 166 are located between the first work function metal layer 164 and the sidewalls S2 of the recess R. For instance, a thickness t2 of the second work function metal layer is at a range of 50-150 angstroms.

To summarize, the present invention provides a buried channel MOSFET and manufacturing method thereof, which forms a dielectric layer having a recess on a substrate, disposes a gate in the recess, forms a buried channel region in the substrate right below the gate, wherein the gate includes a first work function metal layer having a "-" shaped cross-sectional profile, and a minimum distance between each sidewalls of the first work function metal layer and the nearest sidewall of the recess is larger than zero. Therefore, hot carriers induced while voltage being applied can flow in the buried channel region and be far away from a surface of the substrate, to reduce gate impact and circuit leakage such as sub-threshold leakage and gate induced drain leakage (GIDL), hence improving the device reliability.

Preferably, a lightly doped source region and a lightly doped drain region are disposed in the substrate beside the gate, and the first work function metal layer vertically overlaps parts of the lightly doped source region and the lightly doped drain region. Still preferably, a width of the first work function metal layer vertically overlaps the lightly doped drain region is 0-4 times of the minimum distance. Thus, a buried channel having hot carriers flowing therein can be formed between the lightly doped source region and the lightly doped drain region. Furthermore, the buried channel must be formed without the first work function metal layer vertically overlapping the source region and the drain region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A buried channel MOSFET, comprising:
   a dielectric layer having a recess disposed on a substrate;
   a gate disposed in the recess, wherein the gate comprises
      a first work function metal layer having a "-" shaped cross-sectional profile, such that each sidewall of the first work function metal layer has a minimum distance between each sidewall of the recess, the minimum distance being larger than zero so that each sidewall of the first work function metal layer does not physically contact each sidewall of the recess; and
   a buried channel region located in the substrate right below the gate.

2. The buried channel MOSFET according to claim 1, further comprising:
   a source region and a drain region located in the substrate beside the gate.

3. The buried channel MOSFET according to claim 2, wherein the first work function metal layer is disposed between the source region and the drain region without vertically overlapping the source region and the drain region.

4. The buried channel MOSFET according to claim 1, further comprising:
   a lightly doped source region and a lightly doped drain region located in the substrate beside the gate.

5. The buried channel MOSFET according to claim 4, wherein the first work function metal layer is disposed between the lightly doped source region and the lightly doped drain region, and the first work function metal layer vertically overlaps parts of the lightly doped source region and the lightly doped drain region.

6. The buried channel MOSFET according to claim 5, wherein a width of the first work function metal layer vertically overlapping the lightly doped drain region is 0-4 times of the minimum distance.

7. The buried channel MOSFET according to claim 1, wherein the first work function metal layer vertically overlaps the buried channel region completely.

8. The buried channel MOSFET according to claim 7, wherein two ends of the first work function metal layer protrude from the buried channel region.

9. The buried channel MOSFET according to claim 1, wherein a thickness of the first work function metal layer is at a range of 50-100 angstroms.

10. The buried channel MOSFET according to claim 1, further comprising:
    a second work function metal layer conformally covering the first work function metal layer and sidewalls of the recess.

11. The buried channel MOSFET according to claim 10, wherein parts of the second work function metal layer are between the first work function metal layer and the sidewalls of the recess.

12. The buried channel MOSFET according to claim 10, wherein a thickness of the second work function metal layer is at a range of 50-150 angstroms.

13. The buried channel MOSFET according to claim 10, wherein the first work function metal layer and the second work function metal layer have different conductive types.

14. The buried channel MOSFET according to claim 13, wherein the buried channel region and the second work function metal layer are N-type while the first work function metal layer is P-type.

15. The buried channel MOSFET according to claim 1, wherein a depth of the buried channel region from a surface of the substrate is 400-900 angstroms.

16. A method of manufacturing a buried channel MOSFET, comprising:
    providing a substrate;
    forming a buried channel region in the substrate;
    forming a dielectric layer having a recess on the substrate, wherein the recess is right above the buried channel region; and
    forming a first work function metal layer having a "-" shaped cross-sectional profile in the recess, wherein each sidewall of the first work function metal layer having a minimum distance between each sidewall of the recess, the minimum distance being larger than zero so that each sidewall of the first work function metal layer does not physically contact each sidewall of the recess.

17. The method of manufacturing a buried channel MOSFET according to claim 16, further comprising:
    forming a lightly doped source region, a lightly doped drain region, a source region and a drain region in the substrate beside the first work function metal layer before the first work function metal layer is formed.

18. The method of manufacturing a buried channel MOSFET according to claim 17, wherein the first work function metal layer is between the lightly doped source region and the lightly doped drain region, and the first work function metal layer vertically overlaps parts of the lightly doped source region and the lightly doped drain region without vertically overlapping the source region and the drain region.

19. The method of manufacturing a buried channel MOSFET according to claim 16, wherein the first work function metal layer vertically overlaps the buried channel region completely.

20. The method of manufacturing a buried channel MOSFET according to claim 16, wherein forming the first work function metal layer having a "-" shaped cross-sectional profile in the recess further comprises:
- forming a work function metal layer conformally covering a bottom surface and sidewalls of the recess, and the dielectric layer;
- patterning the work function metal layer to remove two end parts of the work function metal layer covering the bottom surface, and sidewall parts of the work function metal layer covering the sidewalls of the recess and the dielectric layer, therefore the first work function metal layer having the "-" shaped cross-sectional profile being formed; and
- forming a second work function metal layer conformally covering the first work function metal layer and the sidewalls of the recess.

* * * * *